(12) United States Patent
Rivard et al.

(10) Patent No.: US 8,507,792 B2
(45) Date of Patent: Aug. 13, 2013

(54) SOLAR PANELS WITH ADHESIVE LAYERS

(75) Inventors: Linda M. Rivard, Stillwater, MN (US); Jeffrey G. Linert, Woodbury, MN (US); Howard S. Creel, Oakdale, MN (US); James R. Peterson, St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 997 days.

(21) Appl. No.: 12/547,004

(22) Filed: Aug. 25, 2009

(65) Prior Publication Data
US 2011/0048536 A1 Mar. 3, 2011

(51) Int. Cl.
*H01L 31/0203* (2006.01)
*C08F 10/02* (2006.01)
*C08F 10/04* (2006.01)

(52) U.S. Cl.
USPC ........... 136/260; 136/252; 136/261; 136/264; 525/191

(58) Field of Classification Search
USPC .................. 136/260, 252, 261, 264; 525/191
See application file for complete search history.

(56) References Cited

U.S. PATENT DOCUMENTS

| | | |
|---|---|---|
| 5,241,014 A | 8/1993 | Kehr |
| 5,364,669 A | 11/1994 | Sumida et al. |
| 5,614,141 A | 3/1997 | Sumida et al. |
| 5,994,474 A | 11/1999 | Wey |
| 7,005,476 B1 | 2/2006 | Terfloth |
| 7,449,629 B2 | 11/2008 | Ferri |
| 7,498,282 B2 | 3/2009 | Patel et al. |
| 2004/0180154 A1 | 9/2004 | Wang |
| 2005/0160940 A1 | 7/2005 | Hippold |
| 2006/0134355 A1 | 6/2006 | Olofsson |
| 2007/0062573 A1 | 3/2007 | Ferri |
| 2008/0017241 A1 | 1/2008 | Anderson |
| 2008/0108757 A1 | 5/2008 | Hoya |

FOREIGN PATENT DOCUMENTS

| | | |
|---|---|---|
| DE | 40 00 695 | 7/1997 |
| EP | 1956661 | 8/2008 |

OTHER PUBLICATIONS

Hans Günther Wey (Hot Melts and Sealants Based on Silane Modified Vestoplast; 1997 Hot Melt Symposium/109, TAPPI Proceedings).*
"Product Information Vestoplast 206 V and Vestoplast 206 B", IDS filed on Nov. 25, 2002 for U.S. Appl. No. 10/224,983.*

* cited by examiner

*Primary Examiner* — Ling Choi
*Assistant Examiner* — Chun-Cheng Wang
(74) *Attorney, Agent, or Firm* — Carlos M. Téllez; 3M Innovative Properties Company

(57) ABSTRACT

The present application is directed to a film they may be used as an adhesive for solar panels. For example, the present application is directed to a composition, for example an adhesive composition, comprising a low crystalline poly-alpha-olefin resin having and an alkoxysilane functional poly-alpha-olefin having a tensile strength of less than 500 MPa. The composition has a melt flow index of less than 30.

The application is also directed to a panel comprising a front panel comprising a transparent barrier, a back panel and a photovoltaic material layer between the front panel and the back panel. An adhesive layer is between the front panel and the back panel, wherein the adhesive layer adheres the front panel to the back panel, and the adhesive layer comprises a low crystalline poly-alpha-olefin elastomer blended with an alkoxysilane functional polyolefin.

22 Claims, 1 Drawing Sheet

SOLAR PANELS WITH ADHESIVE LAYERS

FIELD

This invention relates to a composition useful as an adhesive layer in a solar panel.

BACKGROUND

Photovoltaic solar panels, also referred to simply as solar panels, are generally of two basic designs. One design employs crystalline silicon wafers connected together and embedded in a laminating film. The laminating film and the wafers embedded therein are typically sandwiched between two panels of glass, a polymeric material or other suitable materials.

The second solar panel design employs a semiconducting material, such as amorphous silicon, cadmium-telluride (Cd—Te) or copper-indium-gallium-diselenide, (commonly referred to as "CIGS"), which is deposited on a substrate in a thin film. These thin film photovoltaic materials are typically deposited on a glass substrate by a method such as sputtering, plasma vapor deposition or chemical vapor deposition. The individual photocells are typically formed by a laser etching process, and are connected together by suitable circuitry. To complete the construction, an adhesive is applied over the photovoltaic material and associated circuitry, and a backing material is applied. The backing material is typically glass, but may be metal, a composite or a plastic material.

Solar panels are used outdoors, and so are exposed to the elements, including wind, water and sunlight. Water penetration into solar panels has been a long-standing problem. Thus, various attempts have been made to reduce the water vapor transmission rate of the solar panel (WVTR). Solar panels may also be deleteriously affected by wind and sunlight, which may result in failure of the adhesive layer. Wind causes obvious physical damage, and sunlight results in heating of the solar panel and exposure to ultraviolet (UV) radiation.

Operating temperatures of solar panels have been measured as high as 110 C. Thermoplastic adhesives soften at elevated temperatures, causing creep in the panel, and are susceptible to UV-induced breakdown. Many thermosetting materials suffer from unacceptably high WVTR.

One presently used adhesive is ethylene vinyl acetate (EVA). The EVA is applied to the solar panel, generally including a peroxide which can crosslink the EVA. The EVA is then cured in place on the solar panel. Crosslinked EVA provides high strength, but suffers from a relatively high WVTR.

SUMMARY

The present application is directed to a film that may be used as an adhesive for solar panels.

The present application is directed to a composition, for example an adhesive composition, comprising a low crystalline poly-alpha-olefin resin having and an alkoxysilane functional poly-alpha-olefin having a tensile strength of less than 500 MPa. The composition has a melt flow index of less than 30.

In some embodiments, the low crystalline poly-alpha-olefin has a melting point greater than 20 C. In some embodiments, the low crystalline poly-alpha-olefin has a density according to ASTM D 792 of greater than 0.85. The alkoxysilane functional poly-alpha-olefin may have a tensile strength of less than 100 MPa.

The application is also directed to a panel comprising a front panel comprising a transparent barrier, a back panel and a photovoltaic material layer between the front panel and the back panel. An adhesive layer is between the front panel and the back panel, wherein the adhesive layer adheres the front panel to the back panel, and the adhesive layer comprises a low crystalline poly-alpha-olefin elastomer blended with an alkoxysilane functional polyolefin.

The photovoltaic material may comprises crystalline silica, amorphous silica, cadmium telluride, cadmium sulfide, or copper indium gallium diselenium.

DETAILED DESCRIPTION

Figure 1:
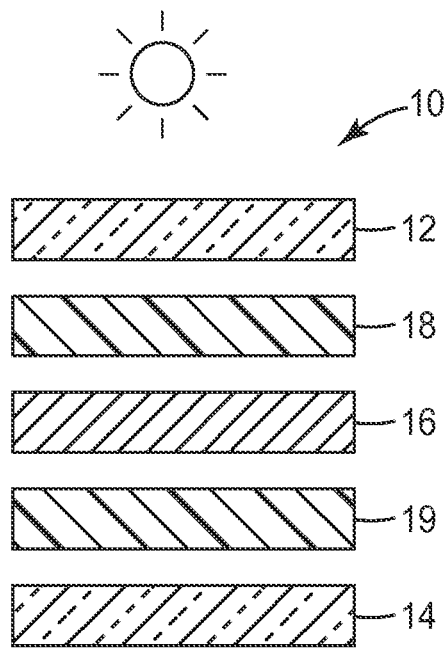
FIG. 1 is a cross sectional, exploded view of a solar panel using the composition of the present application as an adhesive.

The present application is directed to an adhesive composition comprising a thermoplastic polyolefin, such as a low crystalline poly-alpha-olefin resin, and an alkoxysilane functional polyolefin, such as an alkoxysilane functional poly-alpha-olefin. The composition is generally greater than 35% by weight, for example greater than 50% by weight of the thermoplastic polyolefin, for example at least 70% by weight. In some embodiments, the composition comprises additional resins. For example the composition may add additional resins having a softening point higher than 60° C., for example polystyrene or high density polyethylene.

In some embodiments, the composition has less than 5% of a tackifier, specifically less than 1% and in some embodiments, 0% tackifier.

The Melt Flow Index (MFI) of the composition is generally less than 30. MFI is measured using film samples according to ASTM D1238. In some embodiments, the MFI is below 20, and in some instances the MFI is below 15 or below 10. In specific embodiments, the MFI of the composition is less than 7, and in some embodiments less than 2, and in specific embodiments 1 or less. The MFI is related to the melt viscosity of the composition. For example, the higher the melt flow index of a composition, the lower the melt viscosity of that composition. In the present application, the compositions have high melt viscosity, for example in excess of 500,000 cP at 150° C.

The low crystalline poly-alpha-olefin has a melting point higher than 10° C. In some embodiments, the melting point is higher than 20° C. A low crystalline poly-alpha-olefin has a crystallinity (according to a method such as that disclosed in ASTM F2625-07) of less than 30% by weight, for example less than 25%. In specific examples, the low crystalline poly-alpha-olefin has a crystallinity of less than 22%, for example less than 15%. In some embodiments, the low crystallinity poly-alpha-olefin has a density of greater than 0.85 according to ASTM D 792.

For the purposes of the present application, a poly-alpha-olefin refers to polymers comprising a class of hydrocarbons manufactured by the catalytic oligomerization (i.e. polymerization to low-molecular-weight products) of linear-alpha-olefin (LAO) monomers. These typically range from 1-octene to 1-dodecene, with 1-octene being a preferred material, although oligomeric copolymers of lower olefins such as ethylene and propylene may also be used, including copolymers of ethylene with higher olefins. A poly-alpha-olefin may be branched but only if the branch is at least alpha to the double bond, such as 3-methyl-1-pentene.

Useful low crystalline poly-alpha-olefins include polymers (including homopolymers, copolymers and higher) of, e.g., polyethylene. Suitable poly-alpha-olefin polymers include, e.g., homogeneous, substantially linear ethylene-alpha-olefin copolymers or higher with any combination of monomers including, e.g., propylene, 1-butene, 1-pentene, 3-methyl-1-butene, 1-hexene, 3-methyl-1-pentene, 4-methyl-1-pentene, 3-ethyl-1-pentene, 1-octene, 1-decene, and 1-undecene; homogeneous, substantially linear propylene-alpha-olefin copolymers or higher with any combination of monomers including, e.g., ethylene, 1-butene, 1-pentene, 3-methyl-1-butene, 1-hexene, 3-methyl-1-pentene, 4-methyl-1-pentene, 3-ethyl-1-pentene, 1-octene, 1-decene, and 1-undecene; and other low crystalline copolymers with any combination of olefins (e.g., ethylene, propylene, 1-butene, 1-pentene, 3-methyl-1-butene, 1-hexene, 3-methyl-1-pentene, 4-methyl-1-pentene, 3-ethyl-1-pentene, 1-octene, 1-decene, and 1-undecene). The poly-alpha-olefins can be random or block copolymers.

Specific examples of the low crystalline poly-alpha-olefin include those resins sold under the tradenames ENGAGE, available from Dow Chemical Co., and EXACT, available from ExxonMobil Corp. In some embodiments, the low crystalline poly-alpha-olefin is non-chlorinated.

The low crystalline poly-alpha-olefin is blended with an alkoxysilane functional poly-alpha-olefin. The alkoxysilane functional poly-alpha-olefin has a tensile strength of less than 500 MPa, for example less than 100 MPa and in some embodiments less than 10 MPa, even less than 2 MPa according to DIN EN ISO 527-3. Generally, the alkoxysilane functional poly-alpha-olefin is between 0.1 and 10% by weight silane.

The amount of alkoxysilane for grafting on the low crystalline poly-alpha-olefin is from about 0.1% by weight to about 10% by weight, from about 2% by weight to about 6% by weight, or even from about 3% by weight to about 5% by weight, based on the low crystalline poly-alpha-olefin.

Any known method for grafting alkoxysilane onto the low crystalline poly-alpha-olefin can be used including, e.g., solution and melt (e.g., using an appropriate amount of a free-radical donor) methods. Useful methods of preparing silylated low crystalline poly-alpha-olefin are described, e.g., in U.S. Pat. No. 5,994,474 and DE 40 00 695. Suitable examples of free-radical donors include diacyl peroxides such as dilauryl peroxide and didecanoyl peroxide, alkyl peresters such as tert-butyl peroxy-2-ethylhexanoate, perketals such as 1,1-di(tert-butylperoxy)-3,3,5-trimethylcyclohexane or 1,1-di(tert-butylperoxy)cyclohexane, dialkyl peroxides such as tert-butyl cumyl peroxide, di(tert-butyl) peroxide and dicumyl peroxide, C-radical donors including, e.g., 3,4-dimethyl-3,4-diphenylhexane and 2,3-dimethyl-2,3-diphenylbutane, and azo compounds (e.g., 2,2'-azodi (2-acetoxypropane)).

Examples of alkoxysilane functional poly-alpha-olefins are derived from low crystalline poly-alpha-olefin and a silane source. Useful low crystalline poly-alpha-olefins include homopolymers, copolymers and terpolymers including, e.g., atactic polypropylene, atactic poly-1-butene and combinations thereof. The low crystalline poly-alpha-olefins can be random or block copolymers. Other suitable low crystalline poly-alpha-olefin polymers include, e.g., homogeneous substantially linear ethylene-alpha-olefin interpolymers of monomers including, e.g., propylene, 1-butene, 1-pentene, 3-methyl-1-butene, 1-hexene, 3-methyl-1-pentene, 4-methyl-1-pentene, 3-ethyl-1-pentene, 1-octene, 1-decene, and 1-undecene; low crystalline copolymers with other olefins (e.g., ethylene, 1-butene, 1-pentene, 1-hexene, 4-methyl-1-pentene, 1-octene, and 1-decene) containing propylene as a main component, amorphous copolymers with other olefins (e.g., ethylene, propylene, 1-pentene, 1-hexene, 4-methyl-1-pentene, 1-octene, 1-decene and the like) containing 1-butene as a main component; and combinations thereof. Preferred olefin-based low crystalline polymers include atactic polypropylene, propylene/ethylene copolymers, and propylene/1-butene copolymers.

Specific examples of an alkoxysilane functional poly-alpha-olefin are those sold under the tradename VESTOPLAST, available from Evonik Degussa Corp. The tensile strength of the alkoxysilane functional poly-alpha-olefin sold under the tradename Vestoplast 206 has been measured at 6.2 MPa at 23 C using a dumbbell in accordance with JIS K7113-2, the chuck distance of 80 mm and the tensile rate of 200 mm/min.

Water Vapor Transmission Rate (WVTR) is measured according to ASTM Test Method F 1249-90 at 50° C., 100% relative humidity and a nitrogen flow of 100 sccm using an instrument available from MOCON, Inc. The measurements are taken, generally at film thicknesses between 15 and 20 mil. The WVTR of the low crystalline poly-alpha-olefin (at an 18 mil thick film) is greater than 5 $g/m^2$/day. In some embodiments, the WVTR of the low crystalline poly-alpha-olefin is greater than 7 $g/m^2$/day, for example greater than 15 $g/m^2$/day. The WVTR of the alkoxysilane functional poly-alpha-olefin (at an 18 mil thick film) is greater than 0.1 $g/m^2$/day. In some embodiments, the WVTR of the alkoxysilane functional poly-alpha-olefin is greater than 5 $g/m^2$/day, for example greater than 10 $g/m^2$/day, and in some embodiments greater than 12 $g/m^2$/day. For example, films of those sold under the tradename VESTOPLAST 206 (at a 20 mil thick film) have a WVTR of 12.42 $g/m^2$/day when measured using the test method described in the Examples section herein. In embodiments comprising additional resins, the additional resin (at an 18 mil thick film) generally has an WVTR of greater than about 0.1 $g/m^2$/day, for example greater than about 5 $g/m^2$/day. The WVTR of the composition (at an 18 mil thick film) is greater than 3 $g/m^2$/day, for example greater than 5 $g/m^2$/day. In some embodiments, the WVTR of the composition is greater than 7 $g/m^2$/day.

The composition can be made into an adhesive composition or a film. The film can be manufactured using known techniques in the art of film forming, including coating and curing on a release liner and extrusion coating of the composition into a film. In some embodiments, the film is then used as an adhesive under further processing, e.g. heat and pressure.

In some embodiments, additives are added to the composition. Additives include, for example pigments such as carbon black and titanium dioxide; inorganic fillers such as talc, fumed silica, precipitated silica, barium sulfate and calcium carbonate; crosslinkers; ultra-violet absorbers such as hindered amine light stabilizers; anti-oxidants; flame retardants; and catalysts for crosslinking such as organo tin compounds, for example di-n-butyl tin dilaurate. Other suitable catalysts include, for example titanium compounds and metal alkoxides, for example aluminum isopropoxide and zirconium isopropoxide.

In some embodiments, the composition can be used as an adhesive for a solar panel. The adhesive may be referred to as an assembly adhesive, since it is used to assemble and hold together the elements of the solar panel.

A solar panel includes a front panel closest to the sun, a photovoltaic material layer and a backing panel, with the adhesive layer adhering the front panel to the backing panel. Other layers may also be present in the solar panel construction. The solar panel may be of any type known in the art which includes a photovoltaic material layer for generating an electrical current from sunlight impinging upon the solar panel. The photovoltaic material layer may include a layer of crystalline silica, amorphous silica, cadmium telluride, cadmium sulfide, copper-indium-diselenide (CIS), copper-indium-gallium-diselenide, (CIGS), or Group III-V semiconductor material.

The photovoltaic material layers including amorphous silicon, cadmium telluride, CIS or CIGS are susceptible to intrusion of moisture. However, the adhesive disclosed herein may be used with any type of solar panel.

The front panel may be, for example, ordinary borosilicate glass, low-iron glass or a polymer film, specifically a flexible polymer film. The front panel should be a material which allows light transmission sufficient for operation of the photovoltaic circuit.

Figure 2:
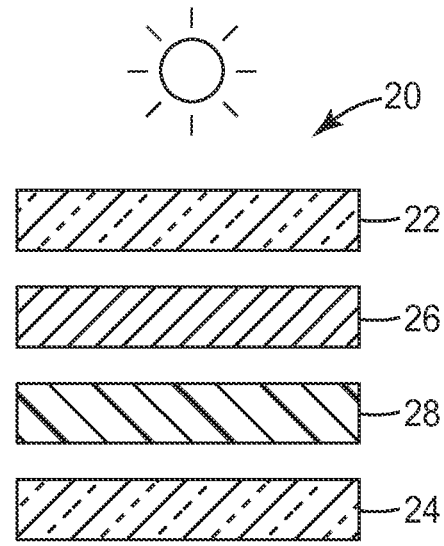
FIG. 2 is a cross sectional, exploded view of a second embodiment of a solar panel using the composition of the present application as an adhesive.
Figure 3:
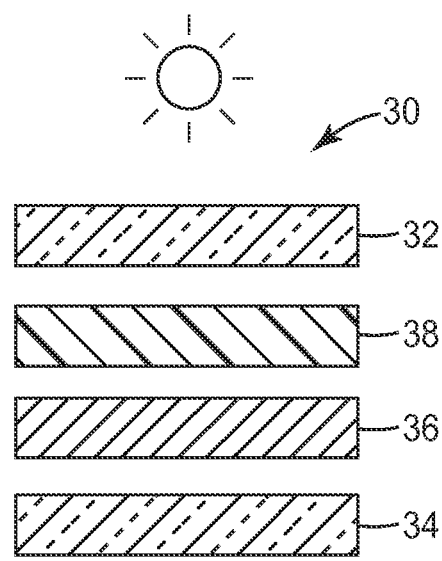
FIG. 3 is a cross sectional, exploded view of a third embodiment of a solar panel using the composition of the present application as an adhesive.

The front panel, the photovoltaic material layer, and the backing panel are adhered together with the adhesive. The adhesive may be a continuous layer or a discontinuous layer. The backing panel provides additional strength to the solar panel and provides protection to the photovoltaic material layer. FIG. 1 shows one embodiment of the solar panel construction 10. The solar panel 10 has a front panel 12, a back panel 14 and photovoltaic material 16. In the embodiment of FIG. 1, the adhesive is present as two layers, 18 and 19 on either side of the photovoltaic material 16. Each adhesive layer 18 or 19 is active in adhering the front panel 12 to the back panel 14. FIG. 2 shows another embodiment of the solar panel construction 20. The solar panel 20 has a front panel 22, a back panel 24 and photovoltaic material 26. An adhesive layer 28 is between the photovoltaic material 26 and the back panel 24. Generally, in such an embodiment, the photovoltaic material layer 26 is formed on the front panel 22 using known methods. FIG. 3 shows another embodiment of the solar panel construction 30. The solar panel 30 has a front panel 32, a back panel 34 and photovoltaic material 36. An adhesive layer 38 is between the photovoltaic material 36 and the front panel 32. Generally, in such an embodiment, the photovoltaic material layer 36 is formed on the back panel 34 using known methods.

Other layers may be included, such as, for example, an anti-reflective coating formed between the front panel and the photovoltaic material layer, to prevent reflection of incoming sunlight out of the solar panel.

Fabrication of a solar panel may be by any method known in the art. Generally, the adhesive is placed between the photovoltaic material and either the front panel, the backing panel, or both as shown in the Figures, and then activated to adhere the backing panel to the photovoltaic material. In some embodiments, the adhesive is further crosslinked.

Generally, the photovoltaic layer will have been separated into individual photovoltaic cells, or photocells. Each of the photocells will have been electrically connected, as appropriate to the design of the solar cell. Such configurations may be appropriately designed or selected by those of skill in the art, and the present invention is not limited to any particular form of photovoltaic material layer.

The adhesive may be delivered in film form with a standard matte finish, for example on a release liner. However, the adhesive may be applied by spraying, extruding, casting, coating, and by other methods.

The adhesive is then placed in relation to the photovoltaic layer. Generally, the assembled layers are consolidated using pressure and/or heat, forming the panel. The adhesive should be applied in a manner so as to avoid the formation of air pockets or bubbles between the respective front and back panels. As such air pockets or bubbles can lead to failure of the solar panel in use.

As stated above, the adhesive may then be crosslinked, especially if a catalyst for crosslinking was added to the composition. Generally, the alkoxysilane functional poly-alpha-olefin is crosslinked and the composition includes a crosslinker.

EXAMPLES

Creep Resistance Testing

Creep resistance is tested by suspending a glass to glass 3 in×6 in or 4 in×8 in (specified in Table 4) lamination in an oven where one side of the lamination is suspended vertically from the top of an oven leaving the other side free to slide. Two wire or plastic ties were attached to an outer side of one of the glass panels with PV1000 adhesive (3M, St. Paul, Minn.) and the laminate was hung at 10-15 degrees to the vertical. If the glass moves more than 0.125 in over 168 hrs it is considered a failure.

Adhesion Testing

Adhesion was tested by exposing a glass to glass 2 in ×4 in lamination to 85° C. and 100% relative humidity for 24 hrs. After exposure, a fingernail or screwdriver is used to pry the glass apart. Failure is when the glass can be at least partially separated from the encapsulant.

Ooze and Void Testing

Significant ooze is defined as the melt flowing out to the extent that it reaches the laminator bed or flowing out to the extent that voiding defects like channels are caused upon cooling of the construction. "0" is no significant ooze, "1" has significant ooze on at least one side and "2" has significant ooze on more than one side and more excessive.

Voids are defined as bubbles, channels of air at the edges, or areas between the glass that are empty. "0" is less then 1% effected, "1" means less than 3% of the encapsulant area is effected and "2" means more than 3% of the encapsulant area is effected.

Melt Flow Index

Melt flow index (MFI) was measured from film samples according to ASTM D1238. The films were cut into 1 in×3 in strips and rolled to fit into the MFI inlet chamber of the TINIUS OLSEN EXTRUSION PLASTOMETER, MP600 version 4.04.

WVTR Testing.

Films were tested for water vapor transmission rate (WVTR) in accordance with ASTM-F1249-06 at 50° C., 100% relative humidity and a nitrogen flow of 100 sccm using a MOCON PERMATRAN W 3/31 WVTR testing system commercially available from MOCON Inc., Mpls., Minn. Film thickness varied between 15 mils and 40 mils. The WVTR was normalized to 1 mil by multiplying film thickness in mils by WVTR.

Example 1

0.5 g of di-n-butyl tin dilaurate (CAS 72-58-7) 95% (Alfa Aesar, Ward Hill, Mass.) was mixed with 49.5 grams of "ENGAGE 8842" pellets (commercially available from DOW CHEMICAL, Midland, Mich.) in a plastic bag until the liquid was evenly spread over the surface of the pellets. 3.5 g of the pellet mixture was added to 21 g "ENGAGE 8842" pellets and mixed before charging the mixture into a Brabender PE 2000A with measuring head type REE 6 for 2-5 minutes at 190° C. and 75 RPM. This was followed by the addition and mixing of 10.5 g strips of "VESTOPLAST 206" (commercially available from EVONIK-DEGUSSA, Essen, Germany). The strips of "VESTOPLAST 206" were made by heating a 55 gallon drum, unloading with a drum unloader onto an aluminum pan, cooling and storing in a desiccator for at least a week and finally cutting into strips with a scissors. A 0.018" film was prepared and tested for WVTR, creep, adhesion and MFI. Melt flow index (MFI) was measured to be 0.54 g/10 min @ 190° C./2.16 kg.

Example 2

Example 2 was prepared as in example 1 except that di-n-butyl tin dilaurate catalyst was excluded. 24.5 g of "ENGAGE 8842" was added to the Brabender at 190° C. followed by 10.5 g of "VESTOPLAST 206" strips. A 0.018" film was prepared and tested for creep, ooze and voids, adhesion and MFI. Melt flow index (MFI) was measured at 190° C. to be 7 g/10 min @ 190° C./2.16 kg.

Example 3

0.5 g of di-n-butyl tin dilaurate (CAS 72-58-7) 95% (Alfa Aesar, Ward Hill, Mass.) was mixed with 49.5 grams of "ENGAGE 8130" pellets (commercially available from DOW CHEMICAL, Midland, Mich.) in a plastic bag until the liquid was evenly spread over the surface of the pellets. 4.0 g of the pellet mixture was added to 28 g "ENGAGE 8130" pellets and mixed before charging the mixture into a Brabender PE 2000A with measuring head type REE 6 for 2-5 minutes at 190° C. and 75 RPM. This was followed by the addition and mixing of 8.0 g strips of "VESTOPLAST 206" (commercially available from EVONIK-DEGUSSA, Essen, Germany). The strips of "VESTOPLAST 206" were made by heating a 55 gallon drum, unloading with a drum unloader onto an aluminum pan, cooling and storing in a desiccator for at least a week and finally cutting into strips with a scissors. A 0.018" film was prepared and tested for creep, adhesion, ooze and voids and MFI. MFI was measured at 190° C. to be 8.4 g/10 min @ 190° C./2.16 kg.

Example 4

0.5 g of di-n-butyl tin dilaurate (CAS 72-58-7) 95% (Alfa Aesar, Ward Hill, Mass.) was mixed with 49.5 grams of "ENGAGE 8842" pellets (commercially available from DOW CHEMICAL, Midland, Mich.) in a plastic bag until the liquid was evenly spread over the surface of the pellets. 4.0 g of the pellet mixture was added to 22 g "ENGAGE 8842" pellets and 6 g "CHEVRON 9640" polyethylene (softening point of 121° C., Chevron Phillips, The Woodlands, Tex.) and mixed before charging the mixture into a Brabender PE 2000A with measuring head type REE 6 for 2-5 minutes at 190° C. and 75 RPM. This was followed by the addition and mixing of 8 g strips of "VESTOPLAST 206" (commercially available from EVONIK-DEGUSSA, Essen, Germany). The strips of "VESTOPLAST 206" were made by heating a 55 gallon drum, unloading with a drum unloader onto an aluminum pan, cooling and storing in a desiccator for at least a week and finally cutting into strips with a scissors. A 0.018" film was prepared and tested for creep, adhesion, ooze and voids and MFI. MFI was measured at 190° C. to be 0.54 g/10 min @ 190° C./2.16 kg.

Example 5

0.5 g of di-n-butyl tin dilaurate (CAS 72-58-7) 95% (Alfa Aesar, Ward Hill, Mass.) was mixed with 49.5 grams of "ENGAGE 8842" pellets (commercially available from DOW CHEMICAL, Midland, Mich.) in a plastic bag until the liquid was evenly spread over the surface of the pellets. 4.0 g of the pellet mixture was added to 22 g "ENGAGE 8842" pellets and 6 g polystyrene (ALFA AESAR M.W. 100,000 lot 10102396) and mixed before charging the mixture into a Brabender PE 2000A with measuring head type REE 6 for 2-5 minutes at 190° C. and 75 RPM. This was followed by the addition and mixing of 8 g strips of "VESTOPLAST 206" (commercially available from EVONIK-DEGUSSA, Essen, Germany). The strips of "VESTOPLAST 206" were made by heating a 55 gallon drum, unloading with a drum unloader onto an aluminum pan, cooling and storing in a desiccator for at least a week and finally cutting into strips with a scissors. A 0.018" film was prepared and tested for creep, adhesion, ooze and voids and MFI. MFI was measured at 190° C. to be 0.49 g/10 min @ 190° C./2.16 kg.

Comparative Example 1

A 0.018" film was prepared from 100% "ENGAGE 8842" pellets and tested for WVTR, creep, adhesion and MFI. Melt flow index (MFI) was taken from Dow Chemical trade literature as 1.0 g/10 min @ 190° C./2.16 kg.

Comparative Example 2

24.5 g of "ENGAGE 8402" (commercially available from DOW CHEMICAL, Midland, Mich.) was added to the mixing bowl at 200° C. followed by 10.5 g of "VESTOPLAST 206" strips. A 0.018" film was prepared and tested for ooze and void. MFI was measured 12.2 g/10 min @ 190° C./2.16. Shrinkage was observed after lamination as the sealing sheet cooled. Oozing and voids were evident as indicated in Table 3.

Comparative Example 3

0.5 g of di-n-butyl tin dilaurate (CAS 72-58-7) 95% (Alfa Aesar, Ward Hill, Mass.) was mixed with 49.5 g of "ENGAGE 8407" pellets (commercially available from DOW CHEMICAL, Midland, Mich.) in a plastic bag until the liquid was evenly spread over the surface of the pellets. 3.5 g of the pellet mixture was added to 21 g "ENGAGE 8407" pellets and mixed before charging the mixture into the Brabender for 2-5 minutes at 190° C. and 75 RPM followed by 10.5 g of "VESTOPLAST 206" strips. A 0.018" film was prepared and tested for ooze, voids and creep.

Lamination

After mixing, the melts were formed into 0.018 in sheets within 15 minutes of mixing using a Wabash press at 330° F. The process to form the film took less then 5 minutes. Films were stored in a desiccator until testing. The films were then vacuum laminated between two pieces of glass using a "SPI-LAMINATOR 350" commercially available from Spire Corporation, Bedford, Mass. The bottom piece of glass had two short and one long piece of 6 mil metal backed tape placed roughly in the shape of an "I". The short pieces are arranged to be 0.5 in from the top or bottom edge and cut to length so that the ends of the tape are 0.5 in from each of the long sides of the glass. The edges of the long piece of tape cover the short pieces of tape such that all the tape pieces are connected in the shape of an "I" with the long tape off center by about 0.25-0.5 in. Table 3 details the lamination times and temperatures and ooze and void testing.

TABLE 1

Glass to Glass Construction Adhesion

| Encapsulant Formulation | Initial Adhesion | Adhesion 24 hrs 85° C./ 100% RH |
|---|---|---|
| EX1 | + | + |
| EX2 | + | + |
| EX3 | + | + |
| EX4 | + | + |
| EX5 | + | + |
| CE1 | + | − |

TABLE 2

MOCON WVTR data, Test Temperature 50° C., 100% RH, Nitrogen Flow 100 sccm

| Encapsulant Formulation | WVTR (g/m$^2$/day) | Film Thickness (mils) | WVTR (g/m$^2$/day)(mil) normalized for thickness |
|---|---|---|---|
| EX1 | 5.1 | 39 | 199 |
| EX2 | 2.4 | 40 | 96 |
| EX3 | 9.4 | 27 | 254 |
| EX4 | 10.1 | 18 | 182 |
| EX5 | 8.8 | 24 | 211 |
| CE1 | 20.9 | 16 | 334 |

TABLE 3

Lamination Conditions and Results.

| Encapsulant | Heat Time (sec) | Press Time (sec) | Laminating Temp ° C. | Ooze | Voids |
|---|---|---|---|---|---|
| EX1 | 250 | 30 | 145 | 0 | 0 |
| EX2 | 250 | 30 | 145 | 0 | 0 |
| EX3 | 180 | 120 | 160 | 0 | 0 |
| EX4 | 180 | 120 | 160 | 0 | 0 |
| EX5 | 120 | 240 | 160 | 0 | 0 |
| CE1 | 250 | 30 | 145 | 1 | 1 |
| CE2 | 250 | 30 | 145 | 2 | 2 |
| CE3 | 250 | 30 | 145 | 2 | 2 |

3 in × 6 in glass laminations.

TABLE 4

Creep Resistance Data

| Encapsulant | Movement of Glass (laminate size) | Temperature ° C. |
|---|---|---|
| EX1 | 0 (3 in × 6 in) | 105 |
| EX2 | 0 (3 in × 6 in) | 85 |
| EX3 | 0.06 in (3.9 in × 7.8 in) | 85 |
| EX4 | 0 (2.75 × 5) | 105 |
| EX5 | 0 (2.75 × 5) | 105 |
| CE1 | 0.35 in (3.0 in × 6 in) | 85 |
| CE3 | 1.25 in (3 in × 6 in) | 85 |

Various modifications and alterations of the present invention will become apparent to those skilled in the art without departing from the spirit and scope of the invention.

What is claimed is:

1. A composition comprising:
a low crystalline poly-alpha-olefin resin; and
an alkoxysilane functional poly-alpha-olefin having a tensile strength of less than 500 MPa,
wherein the composition has a melt flow index of less than 30 g/10 min @ 190° C./2.16 kg; and
wherein the low crystalline poly-alpha-olefin resin has a WVTR of greater than 5 g/m$^2$/day at a film thickness of about 0.46 mm (18 mils) at 50° C. and 100% RH.

2. The composition of claim 1 wherein the melt flow index is less than 20 g/10 min @ 190° C./2.16 kg.

3. The composition of claim 1 wherein the melt flow index is less than 15 g/10 min @ 190° C./2.16 kg.

4. The composition of claim 1 wherein the melt flow index is less than 10 g/10 min @ 190° C./2.16 kg.

5. The composition of claim 1 wherein the melt flow index is less than 7 g/10 min @ 190° C./2.16 kg.

6. The composition of claim 1 wherein the composition has a melt viscosity of greater than 500,000 cP at 150° C.

7. The composition of claim 1 comprising a catalyst.

8. The composition of claim 1 wherein the low crystalline poly-alpha-olefin is non-chlorinated.

9. The composition of claim 1 wherein the low crystalline poly-alpha-olefin has a melting point greater than 20° C.

10. The composition of claim 1 wherein the low crystalline poly-alpha-olefin has a density according to ASTM D 792 of greater than 0.85.

11. The composition of claim 1 wherein the alkoxysilane functional poly-alpha-olefin has a tensile strength of less than 100 MPa.

12. The composition of claim 1 wherein the alkoxysilane functional poly-alpha-olefin has a tensile strength of less than 10 MPa.

13. The composition of claim 1 wherein the low crystalline poly-alpha-olefin resin has a WVTR of greater than about 15 g/m$^2$/day at a film thickness of about 0.46 mm (18 mils) at 50° C. and 100% RH.

14. The composition of claim 1 wherein the alkoxysilane functional poly-alpha-olefin resin has a WVTR of greater than 0.1 g/m$^2$/day at a film thickness of about 0.46 mm (18 mils) at 50° C. and 100% RH.

15. The composition of claim 1 wherein the alkoxysilane functional poly-alpha-olefin resin has a WVTR of greater than about 5 g/m$^2$/day at a film thickness of about 0.46 mm (18 mils) at 50° C. and 100% RH.

16. The composition of claim 1 wherein the composition has an WVTR of greater than 3 g/m$^2$/day at a film thickness of about 0.46 mm (18 mils) at 50° C. and 100% RH.

17. The composition of claim 1 wherein greater than 35 weight percent of the total weight of the composition is low crystalline polyolefin resin.

18. The composition of claim 1 wherein at least 70 weight percent of the total weight of the composition is low crystalline polyolefin resin.

19. The composition of claim 1 wherein the composition comprises an additional resin.

20. The composition of claim 19 wherein the additional resin has a WVTR of greater than about 0.1 g/m$^2$ per day at a film thickness of about 0.46 mm (18 mils) at 50° C. and 100% RH.

21. The composition of claim 19 wherein the additional resin has a WVTR of greater than about 5 g/m$^2$ per day at a film thickness of about 0.46 mm (18 mils) at 50° C. and 100% RH.

22. An article comprising the composition of claim 1 adhered to a second film.

* * * * *